United States Patent [19]

Blumel et al.

[11] Patent Number: 4,672,021

[45] Date of Patent: Jun. 9, 1987

[54] CONTRAST ENHANCEMENT LAYER COMPOSITION WITH NAPHTHOQUINONE DIAZIDE, INDICATOR DYE AND POLYMERIC BINDER

[75] Inventors: David B. Blumel, Hastings-on-Hudson, N.Y.; Albert S. Deutsch, Palo Alto, Calif.

[73] Assignee: Fairmount Chemical Company, Newark, N.J.

[21] Appl. No.: 740,369

[22] Filed: Jun. 3, 1985

[51] Int. Cl.[4] .......................... G03C 1/54; G03C 1/60
[52] U.S. Cl. .................................... 430/191; 430/175; 430/192; 430/193; 430/156; 430/311; 430/312
[58] Field of Search ............... 430/191, 192, 175, 156, 430/311, 312, 193

[56] References Cited

U.S. PATENT DOCUMENTS

| | | | |
|---|---|---|---|
| 3,929,488 | 12/1975 | Smith | 430/191 |
| 3,969,118 | 7/1976 | Stahlhofen et al. | 430/191 |
| 4,125,650 | 11/1978 | Chiu et al. | 430/330 |
| 4,399,210 | 8/1983 | Nagano et al. | 430/191 |
| 4,467,025 | 8/1984 | Goto et al. | 430/191 |
| 4,564,581 | 1/1986 | Curtis et al. | 430/175 |

FOREIGN PATENT DOCUMENTS

| | | | |
|---|---|---|---|
| 1039475 | 8/1966 | United Kingdom | 430/191 |
| 1041463 | 9/1966 | United Kingdom | 430/191 |
| 1170458 | 11/1969 | United Kingdom | 430/191 |
| 1586573 | 3/1981 | United Kingdom | 430/175 |

OTHER PUBLICATIONS

Lange, N. A., "Handbook of Chemistry", 8th Ed., 1952, pp. 942-946.
Grant, J., "Hackh's Chemical Dictionary", 4th Ed., 1969, pp. 344-345.

Primary Examiner—Charles L. Bowers, Jr.
Attorney, Agent, or Firm—Darby & Darby

[57] ABSTRACT

This invention relates to a composition and method for enhancing the contrast of images of an underlying photolithographic layer. A photographic element, including a photoresist layer, is applied to a substrate. The photoresist layer contains a contrast-enhancing layer including at least one light-sensitive compound capable of producing acidic photoproducts upon exposure to actinic radiation, at least one indicator dye that changes color on exposure to acidic conditions and at least one polymeric binder soluble in water or weakly alkaline aqueous solutions. The photographic element is exposed to active radiation sufficient to cause photobleaching of the contrast enhancement layer and exposure of the photoresist layer. The photographic element is exposed to actinic radiation sufficient to cause photobleaching of the contrast enhancement layer and exposure of the photoresist layer. The photographic element is developed in an aqueous photoresist developer, whereby the contrast enhancement layer is stripped from the photoresist layer by the developer.

6 Claims, No Drawings

CONTRAST ENHANCEMENT LAYER COMPOSITION WITH NAPHTHOQUINONE DIAZIDE, INDICATOR DYE AND POLYMERIC BINDER

FIELD OF THE INVENTION

The present invention is directed to a composition and method for enhancing the contrast of images of objects such as masks for photolithography. The invention is particularly useful in the manufacture of semiconductor devices for integrated circuits and components thereof.

BACKGROUND IF THE INVENTION

Photolithography in the production of integrated circuits is predominantly carried out by optical means. Photolithography is in many ways the key to microelectronic technology. It is involved repeatedly in the processing of any device, at least once for each layer of the finished structure. An important requirement of the lithographic process is that each pattern be positioned accurately with respect to the layers under it. One technique is to hold the mask (which serves as a template) just off the surface and to visually align the mask with the existing patterns in the wafer. After perfect alignment is achieved, the mask is pressed into contact with the wafer. The mask is then flooded with ultraviolet radiation to expose the photoresist. The space between the wafer and the mask is often evacuated to achieve intimate contact.

Problems in the masking process arise from the need to print very small features with no defects in the pattern. If the mask were to be positioned very far from the surface, diffraction of the ultraviolet radiation passing through the mask would cause the smaller features to blur together. On the other hand, small particles on the wafer or the mask are abraded into the mask when it is pressed against the wafer. Hence the masks can be used for only a few exposures before the abrasion causes defects to accumulate to an intolerable level.

A more recent trend has been toward using the technique known as projection alignment, in which the image of the mask is projected onto the wafer through an optical system. In this case, mask life is virtually unlimited. Projection alignment is now the predominant method used in photolithographic production of semiconductors. However, the image resolution of projection alignment lithographic systems is approaching the physical limits imposed by practical constraints on numerical aperture and wavelength. Although further improvements in lithographic technology are anticipated, dramatic improvements in inherent lens resolution are not. In order to continue the reduction of minimum feature size achievable by optical techniques, it is necessary to alter some other aspect of the lithographic process for further improvements. The photoresist exposure and development process is one area in which further improvements are possible.

A photoresist is a radiation-sensitive coating that is applied to a substrate, exposed to an image, and developed by a process which selectively removes (or leaves) the resist material that was exposed. For example, a negative photoresist may cross-link and polymerize upon exposure to ultraviolet or other types of radiation. Thus, exposure of the negative photoresist through a mask, followed by a development step (which consists of washing away the non-cross-linked material using selective solvents) results in the removal of the photoresist wherever the mask was opaque.

High contrast is necessary to produce on photoresists the image patterns used in the integrated circuit art. The minimum required contrast of illumination is referred to as the "contrast threshold" of the resist. Depending on substrate properties, the required pattern thickness and resist edge profiles, a conventional positive photoresist has a contrast threshold between about 85% and 90%. Currently, most production is done at 90% contrast, or more. If the contrast threshold of the resist is reduced, the resolution obtainable with a given optical system is improved due to the fact that image contrast is a decreasing function of the spatial frequencies present in the image.

Projection lithography generally uses an aerial image of a mask to expose the photoresist. But as the contrast is reduced, discrimination of a darker area from a lighter area becomes increasingly difficult. For an aerial image of low contrast, even those parts of the image that correspond to the dark regions of the masks have significant intensities. Hence, exposure of the photoresist using a mask of insufficient contrast, causes even dark areas to be exposed to a significant extent. On development, a blurred, poorly resolved photoresist is obtained.

A similar problem occurs in the optical projection of the mask image. The projected radiation has a tendency to scatter due to diffraction around the edge of a light-/dark area in the image. The farther in proximity printing, the image is from the resist, the greater the amount of radiation scatter under intended dark areas of the resist.

To improve contrast, a contrast enhancement layer is used in conjunction with an underlying positive or negative photoresist layer.

European patent application No. 110,165 filed on Oct. 29, 1983 in the name of Griffing and West discloses a contrast-enhancing layer used in conjunction with a photoresist layer. The contrast-enhancing layer consists of a photobleachable material in a resinous binder. The contrast-enhancing layer is applied to the photoresist layer and forms a second, in situ, mask upon exposure to light. Light travels through the mask and acts on a photobleachable dye contained in the contrast-enhancing layer. Areas of the contrast-enhancing layer corresponding to the mask pattern become transparent, and allow the photoresist layer located below the contrast-enhancing layer to be selectively exposed to light according to the pattern of the mask.

Because a certain amount of light is required to render the photobleachable dye transparent, the photoresist layer is exposed only after the photobleachable dye has been made transparent. Dark areas of the mask allow less light transmission and, therefore, take longer to bleach the photobleachable dye of the contrast-enhancing layer. Correspondingly, less light is allowed through the bleached areas of the contrast-enhancing layer to expose the photoresist layer in the dark areas. Hence, the contrast-enhancing layer effectively increases contrast and the net result is a resolution improvement over using the positive resist alone. After the photoresist and contrast-enhancing layers have been exposed, the contrast-enhancing layer is stripped from the exposed photoresist with an organic solvent before development of the exposed photoresist.

Although the contrast-enhancing layer of Griffing and West is capable of increasing contrast and resolution, use of the layer in photolithography requires several extra steps which increase process time and reduce yield and efficiency.

It is an object of the present invention to provide a contrast-enhancing layer which can be used in a standard aqueous photoresist development step without requiring a separate contrast-enhancing layer stripping step prior to photoresist development.

Another object is to provide a CEL that does not intermix with the photoresist it coats.

Another object is to provide a CEL that shows a large decrease in absorbance at 300–450 nm when exposed to those wavelengths.

Another object is to provide a more improved CEL layer capable of further enhancing contrast and/or requiring shorter exposure times.

SUMMARY OF THE INVENTION

The present invention is directed to a contrast-enhancement composition including at least one light-sensitive compound that produces an acidic photo product on exposure to actinic radiation, at least one indicator dye that changes color in the presence of acid, and at least one polymeric binder that is soluble in either water or weakly alkaline aqueous solutions.

Another aspect of the present invention relates to a photographic element comprising a photoresist layer, a contrast-enhancement layer incorporating the above composition and a substrate.

Another aspect of the invention is directed to a method for producing an image in a photographic element by imagewise exposing this element to actinic radiation, the method comprising providing a contrast-enhancing layer incorporating the above composition between a photoresist material and a source of actinic radiation and exposing the photoresist material by actinic radiation sufficient to photobleach the contrast-enhancement layer and expose the underlying photoresist.

DETAILED DESCRIPTION OF THE INVENTION

The contrast enhancement layer (CEL) of the present invention includes compounds having the following characteristics:

a photosensitive compound that generates an acidic photoproduct on exposure to actinic radiation; an indicator dye that changes color in the presence of acid; and at least one polymeric binder that is soluble in either water or weakly alkaline aqueous solutions (pH about 7 or higher).

The photosensitive compound used in the CEL should be sensitive to radiation at wavelengths of 300 to 450 nm. The desired concentration of acidic photoproducts produced on exposure to radiation is a function of the sensitivity of the indicator dye to pH change. Generally, it is desirable that the photosensitive compound produce as large a decrease in pH of the layer as possible, so that the indicator changes color fast.

Examples of the preferred photosensitive compounds that generate acidic photoproducts include naphthoquinone-1,2(diazide-2)-5-sodium sulfonate and naphthoquinone-1,2-(diazide-2)-4-sodium sulfonate. Other suitable compounds include the $BF_4^{31}$ or $PF_6^-$ salts of:

4-diazo-N-ethyl-N-hydroxyethylaniline;
4-diazo-N-methyl-N-hydroxyethylaniline;
4-diazo-2-chloro-N-N'-diethylaniline;
4-diazo-2-methyl-1-pyrrolidine benzene;
4-diazo-2,5-dibutoxy-N-benzoylaniline;
4-diazo-1-morpholinobenzene;
4-diazo-N-ethyl-2-toluidine;
4-diazodiethylaniline;
4-diazodimethylaniline;
4-diazodiphenylamine sulfate; and
4-diazo-2,5-diethoxyphenylmorpholine These materials can be obtained from Fairmount Chemical Co., Inc., Newark, N.J.

During exposure, the naphthoquinone diazide sulfonate (or other compound listed above) is converted to the corresponding indene carboxylic acid. For example:

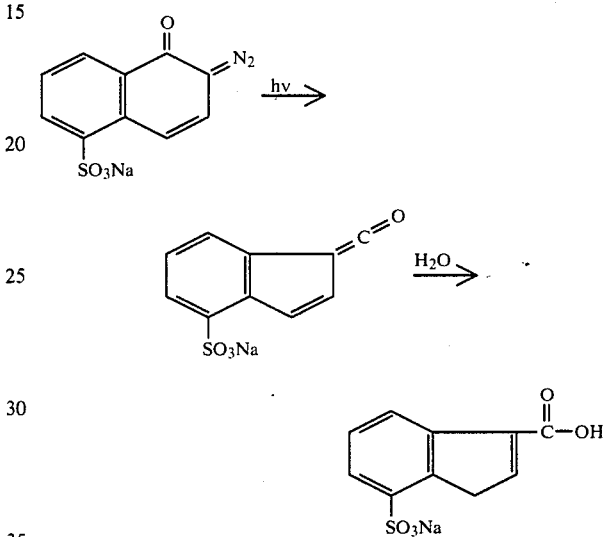

The indicator dyes used should be highly absorbent at 300 to 450 nm until the CEL is exposed. The indicator dye should change color in the presence of the indene carboxylic acid produced by the photoreaction. In addition, absorbance should disappear at 300 to 450 nm.

One advantageous feature of the CEL composition of this invention is that the rate of photo-bleaching of the colored layer will increase during exposure. This increases the effectiveness of the contrast enhancement layer.

Two distinct, sequential, color-destructive reactions are believed to occur when the present compositions are used in contrast-enhancing layers. The first is believed to be the photoconversion of the naphthoquinone diazide to the ketene intermediate (Wolff rearrangement reaction). For example:

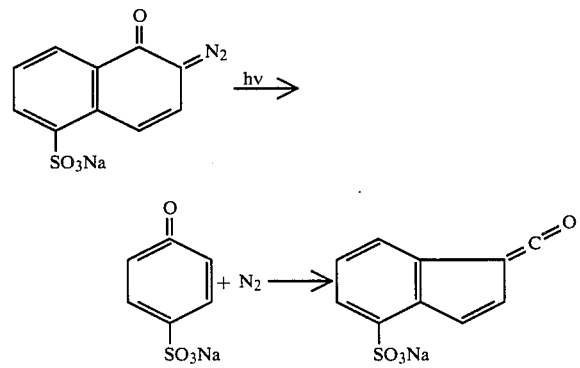

This reaction is believed to cause disappearance of absorbance in the region of 300 to 450 nm to the extent that such absorbance is due to the naphthoquinone diazide.

The second is believed to be the reaction of the ketene with water to form an indene carboxylic acid, as follows:

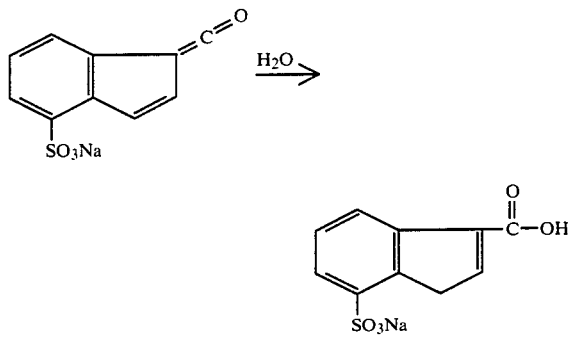

The acid will cause the indicator dye which is highly absorptive in the range of 300 to 450 nm to become transparent to this wavelength.

A time lag exists between the decomposition of the naphthoquinone diazide and the change in color of the indicator dye. Thus, during the initial light exposure, only the color from the naphthoquinone diazide will disappear. But on continued exposure, (further) color bleaching will result from the combined effects of the naphthoquinone diazide photo-reaction and the indicator dye color change due to the presence of acidic photo-products. Thus, the rate of color disappearance increases as exposure continues.

The rate of color disappearance increases even faster (as exposure continues) for yet another reason: at the beginning of exposure, the rate of photobleaching of the naphthoquinone diazide is slowed down by the indicator dye which absorbs some of the incident light that would otherwise be available to bleach the naphthoquinone diazide. Later during exposure, the color of the indicator dye starts to disappear (in response to the formation of the acidic product). As a result, more light is available to bleach the naphthoquinone diazide. This also causes the overall color disappearance to progress at a faster rate.

Under the conditions described above, the exposure latitude is increased and contrast is further enhanced.

Examples of useful indicator dyes include 2,4-dinitrophenol, 3-nitrosalicylaldehyde, metaniline yellow, methyl orange, ethyl orange, propyl red, ethyl red, methyl red, o-nitrophenol, m-nitrophenol, Na-p-nitrophenoxide, and pyridine-2-azo-dimethylaniline. Water soluble forms of the indicator dye are preferred. These dyes may be used alone or in combination. The Na-p-nitrophenoxide is particularly preferred because it normally absorbs strongly at certain wavelengths (e.g. in the region of 405–436 nm) but its absorbance at these wavelengths disappears in acidic media.

The indicator dye and the photobleachable compound (e.g. the naphthoquinone-diazide sulfonate) are held together in a polymeric matrix transparent to radiation at 300–450 nm. The polymer should be soluble in water or mixtures of water and water-miscible organic solvents, and it should also be soluble in weak alkali. More particularly, the polymer should be soluble in developing solutions used to develop photoresist materials. Examples of preferred polymers include poly(vinyl alcohol), poly(vinyl-pyrrolidone) and vinyl-pyrrolidone/vinyl-acetate copolymers.

The polymer, indicator dye, and photosensitive acid-producing compound are dissolved in a solvent such as water, or a mixture of water and a water-miscible organic solvent. Examples of useful water-miscible organic solvents include methanol, ethanol, isopropanol, 2-methoxy ethanol, dimethyl formamide and propylene glycol methyl ether. The solvent mixture should not attack the resist layer. The formation of pinholes or interfacial layers is evidence of intermixing. Therefore, the coated resist should be checked to confirm the absence of pinholes.

The amount of the photosensitive acid-producing compound used in the CEL composition is preferably in the range of about 5 to 90% by weight based on the amount of the polymer, more preferably about 20 to 90% by weight. The amount of indicator dye used should be adjusted according to the acid produced by photobleaching of the acid-producing compound, so that all of the indicator dye changes color. The indicator/photosensitive compound ratio should be at least slightly less than 1:1. Preferably, the indicator will be present in the range of about 20–80% by weight based on the amount of the photosensitive compound, more preferably in the range of about 20–60%.

The solid components, photosensitive compound, indicator dye, and polymer are dissolved in the solvent or solvent mixture in an amount of about 3 to 30 parts by weight, based on 100 parts by weight of the solvent. The percent solids of the final CEL solution will depend on the coating thickness desired and the spin speed used.

A small amount of one or more nonionic surfactants such as FC-431, Zonyl FSN, or Surfynol 485 (obtained from 3M, St. Paul, MN; E. I. DuPont De Nemours & Co., Wilmington, Del.; and Air-Products Co., Allentown, Pa., respectively) may be added to the CEL in the amount of about 0.01 to 1.0% by weight to improve the surface properties of the solution.

The shelf-life of the CEL of the present invention is about one year stored at room temperature.

The prepared CEL is spin-coated on top of a conventional photoresist-coated silicon wafer. The solvent is removed from the CEL by evaporation preferably in a convection oven at about 60° C.–90° C. for about 5–15 mins. When exposed to light by projection through a mask at 300 to 450 nm (monochromatic projection :G-Line —436 nm; H-Line—405 nm; I-Line—367 nm), the CEL becomes selectively relatively transparent in a pattern corresponding to the light areas of the mask. The resist layer is exposed for a period of time long enough to render the CEL transparent in light mask areas only (time exposure would be source-dependent but is generally about twice that required for an uncoated resist); the dark areas of the mask remain dark on the corresponding CEL area. Following exposure, the wafer having the photoresist and CEL is developed by standard developing procedures as explained in more detail below. During development, the CEL is completely stripped from the photoresist layer and a positive, resist image of high resolution is obtained. A negative resist image can be obtained in the same way if an appropriate negative photoresist is used, as is well-known in the art.

The following examples illustrate the present invention but are not intended to limit its scope. Many modifications, additions, or deletions may be made within the scope of the invention and the invention includes all such modifications.

EXAMPLE I

A mixture of 2.4 parts by weight of poly(vinylpyrrolidone) (NP-K-30 GAF Corp.), 2.0 parts of naphthoquinone-1,2-(diazide-2)-5-sodium sulfonate (Fairmount Chem. Co.) 0.4 parts Na-p-nitro-phenoxide and 0.2 parts Zonyl FSN (DuPont) was dissolved in a mixture of 61.2 parts deionized water and 33.8 parts propyleneglycol methyl ether (from Dow Chemical Co., Midland, Mich.), to obtain a CEL solution. The solution was filtered through a 0.2 micron membrane filter (from Millipore). The CEL solution was spin-coated on top of a conventional positive resist (such as positive resist 119 from Fairmount) which was previously coated on an oxidized silicon wafer. The solvent was removed from the CEL following coating by baking the wafer for 10 minutes at 90° C. The wafer was next immersed into a bath of 3.5% aqueous solution of sodium metasilicate for 30 seconds at 22° C., rinsed with water and dried. The CEL layer was completely removed during development in the alkaline solution and no evidence of intermixing (for example pinholes or interfacial layers) was observed on the positive resist layer.

EXAMPLE II

The CEL solution from Example I was coated onto a sheet of 0.3 gauge Melinex 516, polyester film (from ICI, Wilmington, Del.). The solvent was removed by evaporation. A portion of the film was exposed for 5 seconds using a 200 watt high-pressure mercury lamp. The absorbance of the exposed vs. the unexposed coating was measured at 405 and 436 nm. The ratio of:

$$\frac{\text{unexposed absorbance}}{\text{exposed absorbance}}$$

was determined for each wavelength. At 436 nm the ratio was 13.5 and at 405 nm the ratio was 29.5. These values indicate that the CEL upon exposure to light had undergone an absorbance change with absorbance disappearance at both 405 and 436 nm.

EXAMPLE III

The CEL solution of Example I was coated on top of a conventional positive resist (Positive Resist 119) coated wafer for 30 seconds at 3000 rpm. A second positive resist-coated wafer was used as a control left uncoated.

The CEL coated wafer and the control were placed in an oven for 10 minutes at 90° C. The two wafers were exposed for 2 and 4 seconds using a 200 watt high pressure Hg lamp and a 21 step sensitivity guide. The developing conditions were 30 seconds in a 3.5% aqueous solution of sodium metasilicate followed by a water rinse. The results are summarized in Table I. The steps of a 21-step sensitivity guide are graduated in increments of increasing density (from zero to +4).

The first open step achieved indicates that complete light exposure had occurred at this density. The first solid step indicates that this density was opaque to light. On this basis, at approximately two times the exposure of the control the contrast-enhanced sample reproduces the same exposure (that is an open step 3). At exposures in lower intensity than that sufficient to expose a step 4, the light has been absorbed by the CEL. This is evidence that contrast is enhanced.

TABLE I

| | Exposure Time in Seconds | |
|---|---|---|
| | 2 Seconds | 4 Seconds |
| CONTROL | Open 3, Solid 7 | Open 4–5, Solid 9 |
| CONTRAST ENHANCED | not done | Open 3–4, Solid 5 |

EXAMPLE IV

An oxidized silicon wafer, 4 inches in diameter was placed on an SVG 8032 CTD spinner (from Silicon Valley Group). Approximately 2 to 3 ml of hexamethyldisilazane is placed in the center of the wafer. The wafer was then first spun at 500 rpm for 20 seconds followed by spinning at 5000 rpm for 30 seconds. Hexamethyldisilazane is used to promote adhesion between the oxidized silicon wafer and the positive photoresist which is to be subsequently applied. Selectilux ® P-ZLI-2692 which is a positive resist (from E M Chemicals, Hawthorne, N.Y.) was then coated on top of the hexamethyldisilazane layer at a spin speed of 5000 rpm for 30 seconds. After softbaking on a vacuum hot plate for 1 minute at 100° C., the coating thickness was found to be 1.2 microns. The coated wafer was imaged through a chromium mask in a projection scanning system available from Perkin Elmer (Norwalk, Conn.) under the name Micralign ® 300 HT. Aperture 1 was used and had equal lines and spaces from 5 micron lines and spaces to 1.5 micron lines and spaces. The scan setting was 520. After exposure the resist was developed for 60 seconds in a 2.1% solution of tetramethylammonium hydroxide at 22° C. Scanning electron microscope examination of the images showed that the 2.25 micron images were rounded on the top and that the side wall angles were approximately 60°.

EXAMPLE V

The experiment of Example IV was repeated except that the contrast enhancement layer designated CEL-1 was coated on top of the photo-resist coating at a spin speed of 3000 rpm. The coating was then softbaked at 100° C. for 1 minute on a vacuum hot plate. After exposure on the Micralign ® as previously described (except that the scan setting was 440) the coating was developed according to Example IV.

During application of the contrast enhancement layer no intermixing had taken place between the photoresist and contrast enhancement layers. The contrast enhancement layer appeared to be a very uniform coating. The CEL was also easily removed in the developer. Scanning electron microscope evaluation of the images shows that the contrast enhancement layer improves resolution. The 2.0 micron images made with contrast enhancement are flat on the top surface and the side wall angles are approximately 70°–75°. The resolution with the contrast enhancement layer within the 2.0 to 2.25 micron range is improved by at least 0.25 microns.

What is claimed is:

1. A contrast-enhancing, photobleachable composition for use on a photoresist layer comprising:
    a water-soluble, light-sensitive compound which, upon exposure to actinic radiation, produces acidic photoproducts and its absorbance of radiation in the range of about 300 to about 450 nanometers substantially disappears, said compound being selected from the group consisting of napthoquinone-1,2-(diazide-2)-5-sodium sulfonate and naphthoquinone-1,2-(diazide-2-4-sodium sulfonate;

a water-soluble indicator dye which before exposure to acidic conditions is highly absorbent to radiation within the range of about 350 to about 450 nm, but upon exposure to acidic conditions, undergoes a substantial disappearance of its absorbance of radiation in said range, said dye being selected from the group consisting of 2,4-dinitrophenol, 3-nitrosalicylaldehyde, metaniline yellow, methyl orange, ethyl orange, propyl red, ethyl red, methyl red, o-nitrophenol, n-nitrophenol, sodium-p-nitrophenoxide and pyridine-2-azodimethylaniline; and a polymeric binder which is substantially transparent to radiation in the range of about 300 to about 450 nanometers and is soluble in a member selected from the group consisting of water and weakly alkaline aqueous solutions;

Wherein said compound is provided in an amount ranging between about 5 and about 90% by weight based on said polymeric binder and said indicator dye is provided in an amount not exceeding the maximum amount that can be rendered transparent to said radiation range by said acidic photoproducts of said compound.

2. The composition of claim 1, wherein said binder is soluble in the developing solutions used for the development fo photoresist materials.

3. The composition of claim 2 wherein said polymeric binder is slected from the group consisting of poly(vinyl alcohol), poly(vinyl pyrrolidone) and vinyl pyrrolidone-vinyl acetate copolymers.

4. The composition of claim 1 wherein said indicator is sodium-p-nitophenoxide.

5. The composition of claim 3 wherein said polymeric binder is selected from the group consisting of poly(vinyl alcohol), poly(vinyl pyrrolidone) and vinyl pyrrolidone/vinyl acetate copolymers.

6. The composition of claim 5 further comprising a solvent selected from the group consisting of water, watermiscible organic solvents and mixtures thereof.

* * * * *